(12) United States Patent
Kim et al.

(10) Patent No.: US 8,947,928 B2
(45) Date of Patent: Feb. 3, 2015

(54) FLASH MEMORY DEVICE AND MEMORY SYSTEM INCLUDING THE SAME

(75) Inventors: Seung-bum Kim, Hwaseong-si (KR); Dong-ku Kang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 144 days.

(21) Appl. No.: 13/449,366

(22) Filed: Apr. 18, 2012

(65) Prior Publication Data

US 2012/0287711 A1    Nov. 15, 2012

(30) Foreign Application Priority Data

May 9, 2011    (KR) ........................ 10-2011-0043442

(51) Int. Cl.
*G11C 16/04*      (2006.01)
*G11C 16/26*      (2006.01)
*G11C 11/56*      (2006.01)
*G11C 16/34*      (2006.01)

(52) U.S. Cl.
CPC ............ *G11C 16/26* (2013.01); *G11C 11/5642* (2013.01); *G11C 16/0483* (2013.01); *G11C 16/3418* (2013.01)
USPC ..................................... 365/185.03; 365/211

(58) Field of Classification Search
None
See application file for complete search history.

(56) References Cited

U.S. PATENT DOCUMENTS

| 5,406,529 | A  | * | 4/1995  | Asano ....................... 365/230.03 |
| 6,426,893 | B1 | * | 7/2002  | Conley et al. ............. 365/185.11 |
| 2006/0285408 | A1 | * | 12/2006 | Betser et al. .................. 365/212 |
| 2009/0296465 | A1 | * | 12/2009 | Wang et al. ................ 365/185.2 |
| 2009/0316489 | A1 | * | 12/2009 | Han ......................... 365/185.25 |

FOREIGN PATENT DOCUMENTS

| JP | 2006-196078 | 7/2006 |
| KR | 1020080104837 A | 3/2008 |
| KR | 1020100048609 A | 5/2010 |

\* cited by examiner

*Primary Examiner* — James G Norman
(74) *Attorney, Agent, or Firm* — Volentine & Whitt, PLLC

(57) ABSTRACT

A flash memory device includes a memory cell array, a temperature sensing unit, and a control unit. The memory cell array is configured to store a plurality of pieces of configuration data corresponding to respective temperature levels of the flash memory device, the pieces of configuration data indicative of respective operation parameter values of the flash memory device. The temperature sensing unit is configured to measure an ambient temperature of the flash memory device and to generate temperature level data. The a control unit is configured to receive the temperature level data from the temperature sensing unit, to read a piece of configuration data corresponding to the temperature level data from among the plurality of pieces of configuration data stored in the memory cell array, and to set operation parameters of the flash memory device according to an operation parameter value indicated by the read piece of configuration data.

15 Claims, 13 Drawing Sheets

FLASH MEMORY DEVICE AND MEMORY SYSTEM INCLUDING THE SAME

CROSS-REFERENCE TO RELATED APPLICATIONS

A claim of priority is made to Korean Patent Application No. 10-2011-0043442, filed on May 9, 2011, in the Korean Intellectual Property Office, the disclosure of which is incorporated herein in its entirety by reference.

BACKGROUND

The inventive concept relates to a flash memory device and a memory system including the same, and more particularly, to a flash memory device and a memory system including the same by which operating circumstances are optimized according to temperatures.

Continuing efforts to improve the performance of flash memory devices have resulted in increases in both the integration density of memory cells and the number of bits stored in each of the memory cells. This has resulted in a reduction in read margins, increasing the likelihood of read errors. Various techniques have been attempted to minimize or prevent read failures. For example, a read failure may be avoided by controlling a pass voltage level or read voltage level during a read operation.

In the meantime, a threshold voltage of a flash memory cell tends to vary with a variation in temperature. This variation of threshold voltage can further reduce read margins, and can alter conditions upon which preventative measures to avoid read failures have been premised. As a result, the operating reliability of the flash memory devices may deteriorate with temperature variations.

SUMMARY

According to an aspect of the inventive concept, a flash memory device includes a memory cell array, a temperature sensing unit, and a control unit. The memory cell array is configured to store a plurality of pieces of configuration data corresponding to respective temperature levels of the flash memory device, the pieces of configuration data indicative of respective operation parameter values of the flash memory device. The temperature sensing unit is configured to measure an ambient temperature of the flash memory device and to generate temperature level data. The a control unit is configured to receive the temperature level data from the temperature sensing unit, to read a piece of configuration data corresponding to the temperature level data from among the plurality of pieces of configuration data stored in the memory cell array, and to set operation parameters of the flash memory device according to an operation parameter value indicated by the read piece of configuration data.

According to another aspect of the inventive concept, a memory system includes a flash memory device, a temperature sensing unit, and a memory controller. The flash memory device is configured to store a plurality of pieces of configuration data indicative of operation parameter values at temperature levels set according to predetermined temperature sections or discrete temperatures. The temperature sensing unit is configured to measure an ambient temperature of the flash memory device and to generate temperature level data. The memory controller is configured to receive the temperature level data from the temperature sensing unit, to read one piece of configuration data corresponding to the temperature level data among the plurality of pieces of configuration data from the flash memory device, and to set operation parameter values using the read configuration data.

According to still another aspect of the inventive concept, a memory device includes a temperature sensing unit, a flash memory array, and a control unit. The temperature sensing unit is configured to sense an ambient temperature. The flash memory array including a user data area comprising multi-level cell (MLC) memory cells, and a configuration data area storing a plurality of pieces of configuration data indicative of respective read parameters of a read operation of the MLC memory cells, the plurality of pieces of configuration data corresponding to respectively different measured ambient temperatures of the memory device. The control unit is configured to receive the temperature level data indicative of the ambient temperature sensed by the temperature sensing unit, and to execute a read operation of the MLC memory cells using a read parameter indicated by a piece of configuration data corresponding to the temperature level data.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
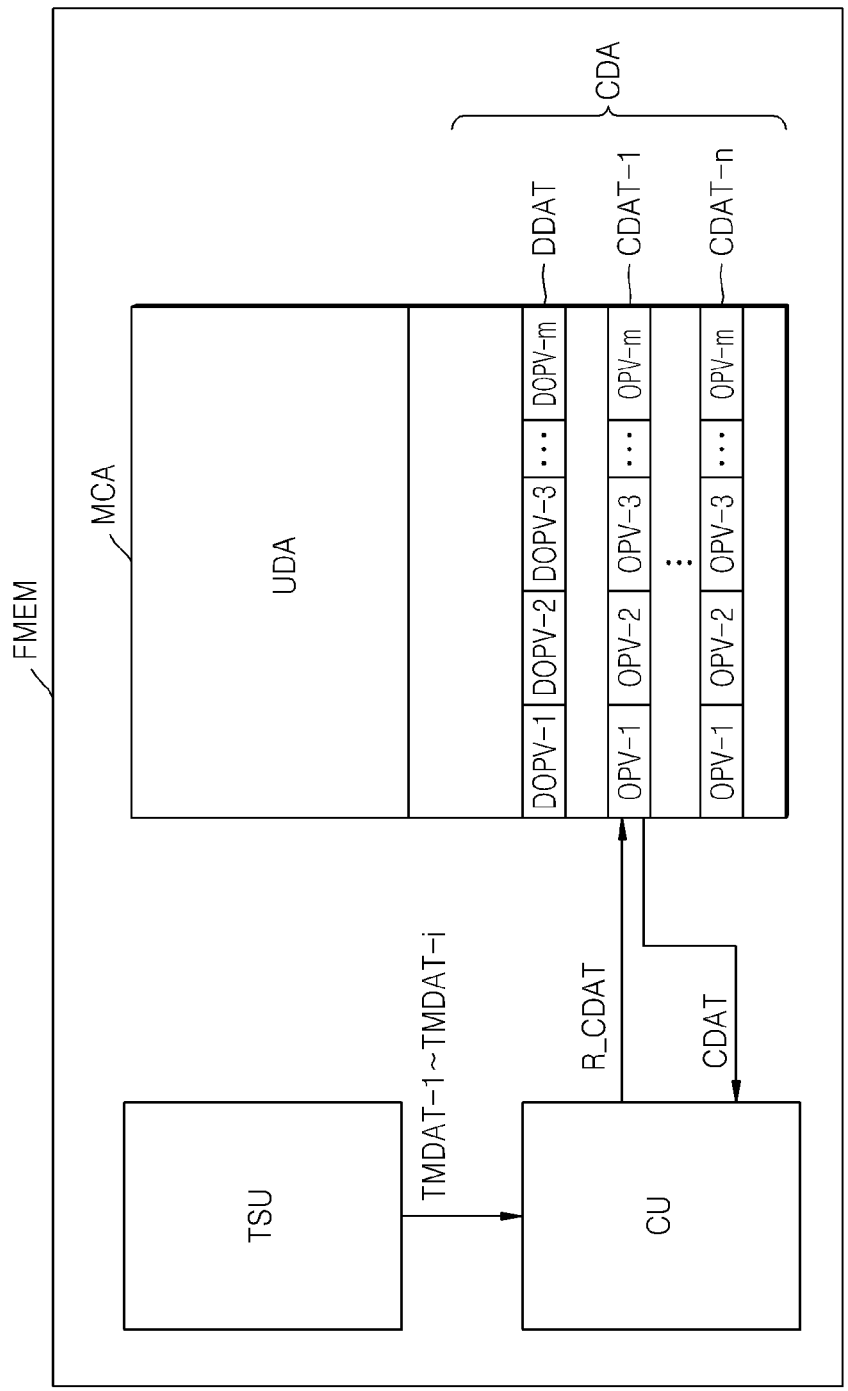
FIG. 1 is a block diagram of a flash memory device (FMEM) according to exemplary embodiments of the inventive concept.

The inventive concept will now be described more fully hereinafter with reference to the accompanying drawings, in which exemplary embodiments of the inventive concept are shown. The same reference numerals are used to denote the same elements throughout the specification.

FIG. 1 is a block diagram of a flash memory device (FMEM) according to exemplary embodiments of the inventive concept. As shown, the FMEM of this example includes a temperature sensing unit (TSU), a control unit (CU) and a memory cell array MCA.

The memory cell array MCA may store a plurality of pieces of configuration data CDA of the FMEM at respective temperature levels of the FMEM. The CDA includes configuration CDAT-1 to CDAT-n each including operation parameter values OPV-1 to OPV-m, and default configuration data DDAT including default operation parameter values DOPV-1 to DOPV-m.

In operation, when power is applied to the FMEM or a temperature varies during operation of the FMEM, a temperature sensing unit (TSU) may measure a surrounding temperature (i.e., an ambient temperature), determine a temperature level of the FMEM, and generate temperature level data TMDAT. A control unit CU may transmit a read signal R_CDAT to the memory cell array MCA based on the temperature level data TMDAT transmitted by the TSU and read configuration data CDAT corresponding to the temperature level data TMDAT. Also, the control unit CU may set the operation parameter values of the FMEM based on the read configuration data CDAT. Accordingly, the FMEM according to one exemplary embodiment of the inventive concept may effectively cope with a temperature variation.

Figure 2A:
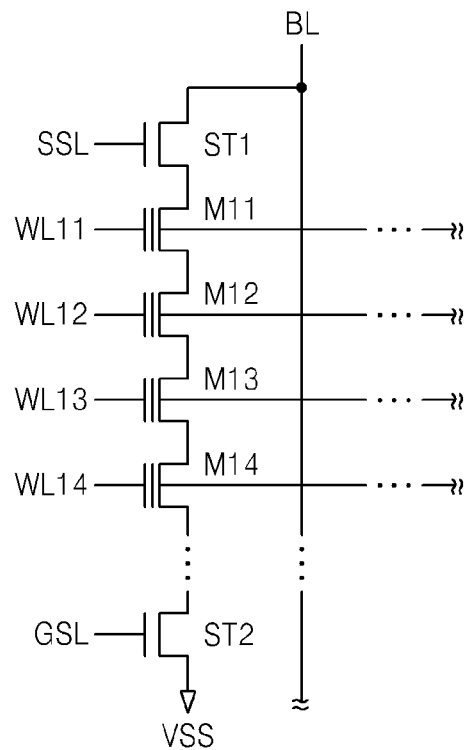
FIG. 2A is a circuit diagram of a memory cell included in a typical NAND-type FMEM.

The memory cell array MCA may include a plurality of memory cells connected to one another as shown in FIG. 2A. FIG. 2A shows memory cells included in a typical NAND FMEM. FIG. 2A illustrates a plurality of word lines WL11 to WL14 and a plurality of memory cells M11 to M14, and the plurality of memory cells M11 to M14 may form a string structure along with selection transistors ST1 and ST2 and be connected in series between a bit line BL and a ground voltage VSS. Since a small cell current is used, the NAND FMEM may program all memory cells connected to one word line during only one program operation.

Figure 2B:
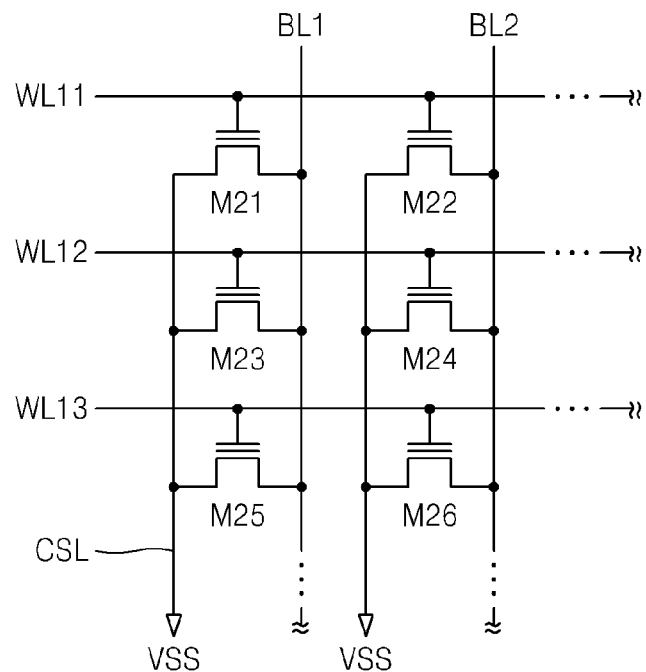
FIG. 2B is a circuit diagram of a memory cell included in a typical NOR-type FMEM.

In addition, the memory cell array MCA may include a plurality of memory cells connected as shown in FIG. 2B. FIG. 2B is a circuit diagram of the memory cells included in a typical NOR-type FMEM. As shown in FIG. 2B, in the NOR-type FMEM, each memory cell M21 to M26 may be connected between bit lines BL1 and BL2 and a common source line CSL. Since the NOR-type FMEM consumes a large current during a program operation, the NOR-type FMEM may program a smaller number of memory cells than a NAND-type FMEM during one program operation.

Figure 2C:
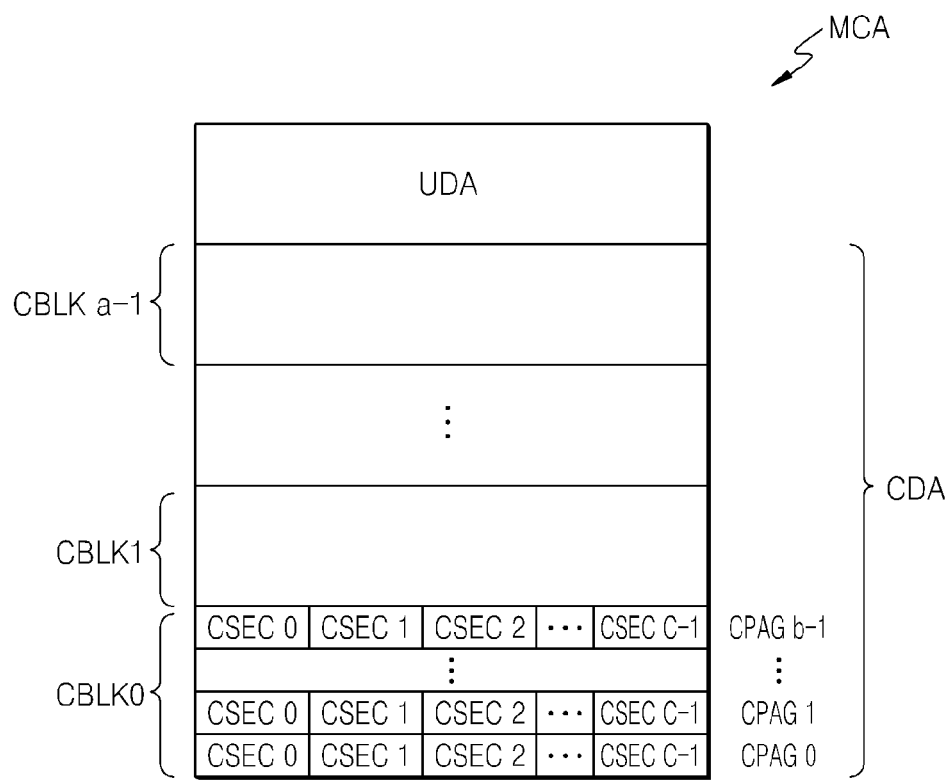
FIG. 2C is a diagram showing a memory cell array MCA serving as a storage region of the FMEM of FIG. 1.

The memory cell array MCA, which is a storage region of a FMEM according to exemplary embodiments of the inventive concept, may have a structure shown in FIG. 2C. The memory cell array MCA may include a user data area UDA for storing user data and a configuration data area CDA for storing a plurality of pieces of configuration data CDAT-1 to CDAT-n and default configuration data DDAT. The user data may refer to data to be programmed in a memory cell of the user data area UDA by a user, and the configuration data CDAT-1 to CDAT-n may be the same as described above.

For example, the configuration data area CDA of the memory cell array MCA may include memory blocks CBLK0 to CBLKa-1 (a is an integer equal to or more than 2). Each of the memory blocks CBLK0 to CBLKa-1 may include b pages CPAG0 to CPAGb-1 (b is an integer equal to or more than 2), each of which may include c sectors CSEC0 to CSECc-1 (c is an integer equal to or more than 2). Although FIG. 2C illustrates only the b pages CPAG0 to CPAGb-1 and the c sectors CSEC0 to CSECc-1 of the block CBLK0, for brevity, each of the other blocks CBLK1 to CBLKa-1 may have the same structure as the block CBLK0. Also, the user data areas UDA may have the same structure as the configuration data areas CDA.

Although FIG. 1 illustrates that the FMEM includes only one memory cell array MCA, the FMEM may include a plurality of memory cell arrays MCA, each memory cell array MCA having the same structure and capable of the same operation and function as the above-described memory cell array MCA. However, it is assumed here for brevity that the FMEM includes one memory cell array MCA.

Referring back to FIG. 1, the default configuration data DDAT and the plurality of pieces of configuration data CDAT-1 to CDAT-n may be stored in the configuration data region CDA. The default configuration data DDAT may correspond to one of the plurality of pieces of configuration data CDAT-1 to CDAT-n and include default operation parameter values DOPV-1 to DOPV-m measured at a reference temperature (for example, room temperature) or at a temperature designated by a user. Initial operating conditions of the FMEM may be set using the default operation parameter values DOPV-1 to DOPV-m of the default configuration data DDAT.

The configuration data CDAT-1 to CDAT-n may be stored as an electrical fuse (e-fuse) type in the configuration data area CDA. An e-fuse refers to a technique of storing various data in a memory cell, instead of a conventional laser fuse, reading the data during an operation of a memory chip, and transmitting the data by turning on or off the corresponding memory switch.

In general, DC trim information for a chip operation, option information, and repair and bad block information may be stored as an e-fuse type storage. The FMEM according to an exemplary embodiment of the inventive concept may store the configuration data CDAT-1 to CDAT-n including the operation parameter values OPV-1 to OPV-m as an e-fuse type storage. The operation parameter values OPV-1 to OPV-m may be read-voltage (Vread) level values and/or pass-voltage (Vpass) level values during a data read operation of the FMEM. Also, the operation parameter values OPV-1 to OPV-m may be parameter values obtained by a boosting scheme option for generating internal voltages of the FMEM in sequence or parallel. Data regarding configuration values required for operations of the FMEM, that is, configuration data CDAT-1 to CDAT-n, may be previously stored during the testing of a specific region of a memory cell.

A threshold voltage of a memory cell of an FMEM may vary according to an outer or inner temperature of the FMEM. Due to the dependence of the threshold voltage on the temperature of the FMEM, optimum vales of the operation parameter values OPV-1 to OPV-m (e.g., voltages having various levels) included in the configuration data CDAT-1 to CDAT-n may depend on an inner temperature of the FMEM. Hereinafter, the influence of temperature on the operation parameter values OPV-1 to OPV-m of the FMEM during read and program operations will be described.

Figure 3A:
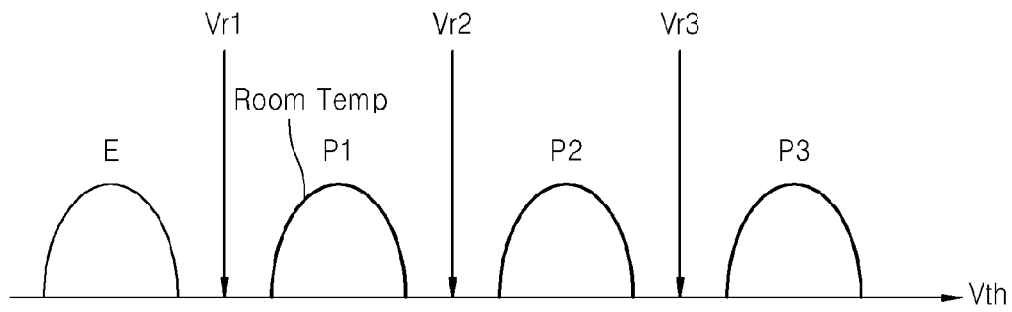
FIGS. 3A through 3C are diagrams showing a variation in threshold voltage relative to a variation in temperature of a memory cell.
Figure 3B:
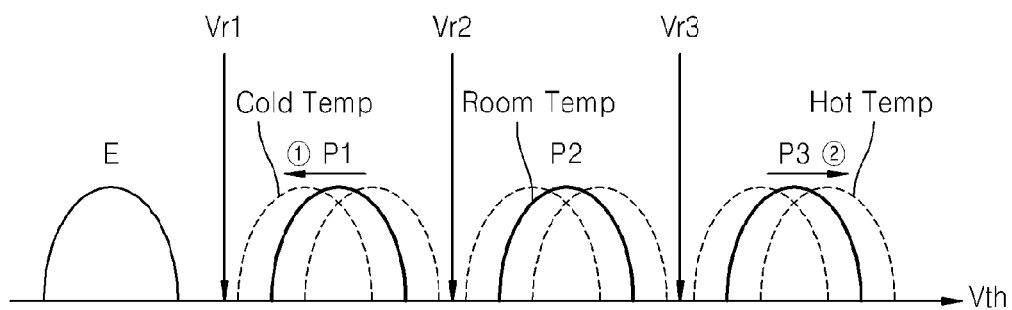
Figure 3C:
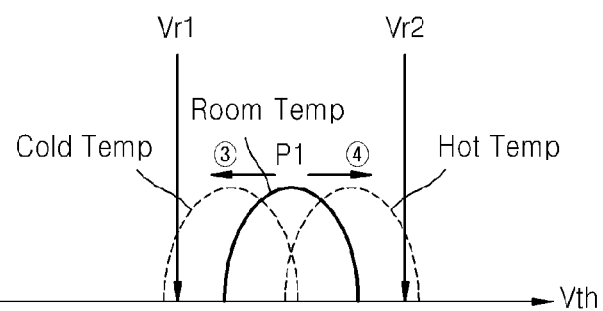

FIGS. 3A through 3C are diagrams showing a variation in threshold voltage distribution relative to a variation in temperature of a memory cell shown in FIG. 2A or 2B (particularly, a multi-level cell in which two bits are stored). FIG. 3A shows a cell distribution measured at a reference temperature, for example, at room temperature, with solid lines. Referring to FIG. 3A, the memory cell may have any one of four states, namely, an erase state E, and first, second, and third program states P1, P2, and P3. One of the selected read voltages, namely, first, second, and third read voltages Vr1, Vr2, and Vr3, may be applied to a selected word line (e.g., WL11 in FIG. 2A) during a read operation, while an unselected read voltage Vread may be applied to an unselected word line (e.g., WL12 in FIG. 2A). The first selected read voltage Vr1 may have a voltage level between the erase state E and the first program state P1, the second selected read voltage Vr2 may have a voltage level between the first program state P1 and the second program state P2, and the third selected read voltage Vr3 may have a voltage level between the second program state P2 and the third program state P3.

In FIG. 3B, solid lines are cell distributions measured at room temperature, as in FIG. 3A. However, when a memory cell is programmed at a relatively cool temperature lower than the room temperature, a threshold voltage of the memory cell moves toward a low value (refer to arrow ①). For example, when a NAND FMEM is programmed at a low temperature, a potential barrier by which Fowler-Nordheim (FN) tunnelling of a memory cell is caused may be lowered. Also, more channel electrons may move toward a floating gate of the memory cell. In this case, even if a gate voltage of the memory cell is low during a read operation, a channel may be easily formed. Thus, a threshold voltage of the memory cell may be reduce. On the other hand, when a memory cell is programmed at a warm temperature higher than the room temperature, the threshold voltage of the memory cell moves toward a high value (refer to arrow ②).

When a FMEM performs a program operation at a relatively cool temperature and performs a read operation at a relatively warm temperature, a read margin of the FMEM may be reduced. In FIG. 3B, assuming that the level of the selected read voltages Vr1, Vr2, and Vr3 are constant respectively, when the threshold voltage of the memory cell moves left, the read margin may be reduced as much. Similarly, when the FMEM performs the program operation at a relatively warm temperature and performs the read operation at a reference temperature, the read margin of the FMEM may be reduced.

FIG. 3C shows a distribution of memory cells measured when a read failure occurs. FIG. 3C shows the first program state P1, the first selected voltage Vr1, and the second selected voltage Vr2. Assuming that the level of the first and the second selected voltages Vr1 and Vr2 are each constant and a read operation is performed at room temperature, when an FMEM is programmed at a relatively cool temperature and a threshold voltage of a memory cell moves toward a lower value (refer to arrow ③), a read failure may occur. Also, when the FMEM is programmed at a relatively warm temperature and the threshold voltage of the memory cell moves toward a higher value (refer to arrow ④), a read failure may similarly occur.

As described above, a variation in temperature may lead to a variation in threshold voltage, thereby reducing a read margin and causing a read failure. Accordingly, to overcome these drawbacks, a level of a read voltage Vread, which is one of the operation parameter values of the FMEM, is controlled in consideration of a temperature at which user data is programmed.

When user data is programmed in a memory cell, the operation parameter values may be affected by temperature. When the user data is programmed in a memory cell array, unprogrammed memory cells need to be boosted to a preset level by a pass voltage Vpass. Otherwise, the user data may be programmed at a program voltage Vpgm to cause program disturbance, thus resulting in generation of program failure bits. However, when a level of the pass voltage Vpass is within a predetermined voltage section during the program operation of the FMEM, program disturbance may not be caused by the program voltage Vpgm and the pass voltage Vpass, so failure bits may not be generated. This will now be described with reference to FIGS. 4A through 4C.

Figure 4A:
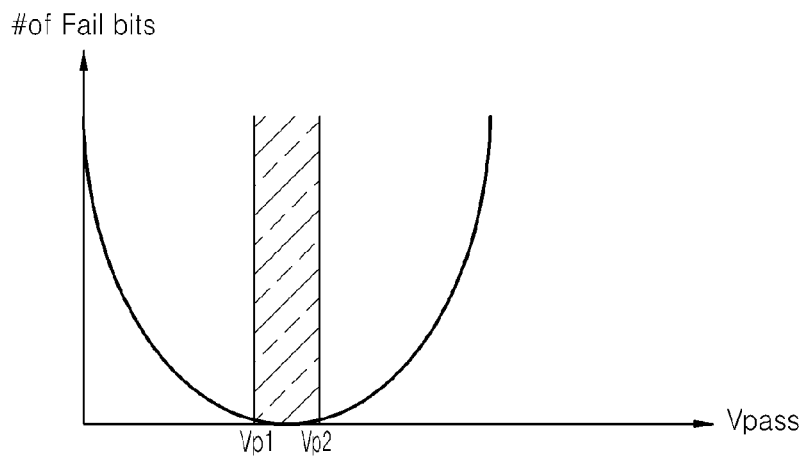
FIGS. 4A through 4C are diagrams showing a variation in pass voltage relative to a variation in temperature during a program operation as an example of operation parameters.
Figure 4B:
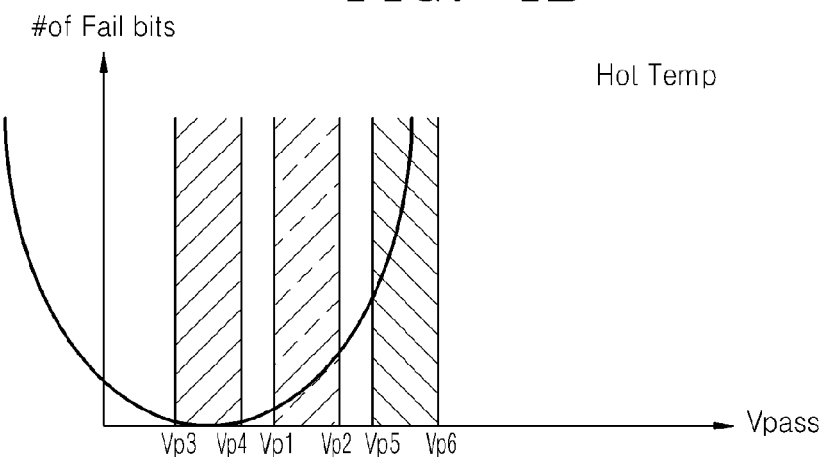
Figure 4C:
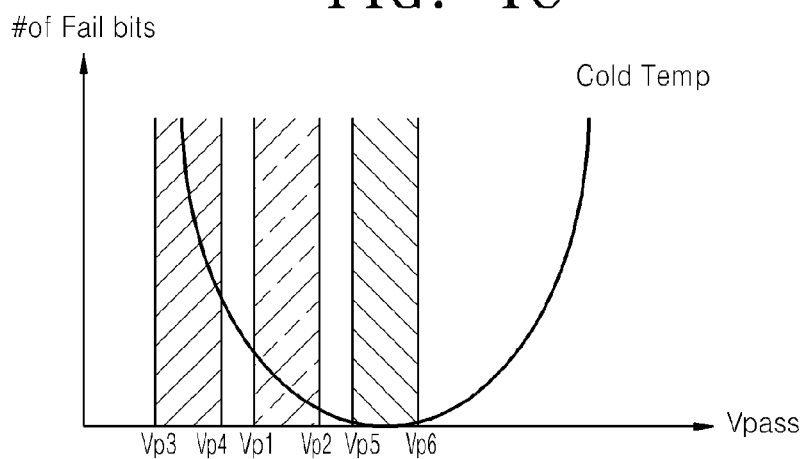

FIGS. 4A through 4C show pass voltage windows during a program operation of an FMEM. A pass voltage window refers to a range of a pass voltage Vpass within which failure bits are not generated by program disturbance during a program operation. It is assumed that a pass voltage window (Vp1~Vp2) of FIG. 4A refers to a range of the pass voltage Vpass within which failure bits are not generated at a reference temperature, for example, at room temperature. FIG. 4B shows a pass voltage window obtained at a relative warm temperature (i.e., above room temperature) higher than that corresponding to the pass voltage window of FIG. 4A. Referring to FIG. 4B, a lowest level of the pass voltage Vpass required not to cause program disturbance is Vp3, and a highest level thereof is Vp4. That is, when a temperature increases, the pass voltage window is lowered from the range of from Vp1 to Vp2 to the range of from Vp3 to Vp4. FIG. 4C shows a pass voltage window obtained at a relatively cool temperature (i.e., below room temperature) lower than that corresponding to the pass voltage window of FIG. 4A. Referring to FIG. 4C, a lowest level of the pass voltage Vpass required not to cause program disturbance is Vp5, and a highest level thereof is Vp6. That is, when a temperature deceases, the pass voltage window is elevated from the range of from Vp1 to Vp2 to the range of from Vp5 to Vp6.

As described above, the pass voltage window may vary with a peripheral temperature. Accordingly, the occurrence of program failure bits may be prevented by controlling the pass voltage (Vpass) level, which is one operation parameter value of the FMEM, according to a temperature.

As explained thus far, since the FMEM is affected by temperature, when the operation parameter values OPV-1 to OPV-m of the FMEM are not controlled according to a temperature, a read failure may occur during a read operation. Also, the number of program failure bits may increase during a program operation. To set the operation parameter values OPV-1 to OPV-m according to a varying temperature, configuration data CDAT-1 to CDAT-n including optimized operation parameter values OPV-1 to OPV-m corresponding respectively to varying temperatures of the FMEM may be stored as an e-fuse type storage in the configuration data area CDA of the memory cell array MCA. Furthermore, an operation option of the FMEM according to a temperature may be effectively embodied using the configuration data CDAT-1 to CDAT-n.

Temperature levels (or temperatures of the FMEM) corresponding to the plurality of pieces of configuration data CDAT-1 to CDAT-n may be set as follows.

Table 1 shows examples of temperature levels set according to discrete temperatures of the FMEM.

TABLE 1

| | Temperature level | | | | | | | |
|---|---|---|---|---|---|---|---|---|
| | 1 | 2 | 3 | 4 | 5 | 6 | 7 | 8 |
| Temperature (° C.) | −25 | −10 | 0 | 10 | 25 | 40 | 55 | 70 |

As shown in Table 1, the temperature levels may be set according to discrete temperature values, such as temperatures of about −25° C., 0° C., and 40° C. Temperatures at which respective operation parameter values vary within large ranges may be experimentally determined during a test operation to set the temperature levels. Alternatively, the temperature levels may be set by temperatures at which the FMEM is mainly employed. Also, when the operating environment of the FMEM is subjected to a small variation in temperature, a difference between the discrete temperatures may be set as a smaller value. For example, although Table 1 shows a difference of about 10° C. or 15° C. between the respective temperature levels, the difference between the temperature levels may be set to smaller values. In contrast, when the operating environment of the FMEM is subjected to a big variation in temperature, the difference between the discrete temperatures may be set as a larger value. For example, although Table 1 shows 8 temperature levels, a larger number of temperature levels may be set, and the temperature levels may be set according to temperatures expressed in decimal form. By setting the temperature levels according to discrete temperature levels, configuration data CDAT-1 to CDAT-n may be stored in the configuration data areas CDA according to the respective temperature levels.

Table 2 shows examples of temperature levels of the FMEM set according to predetermined temperature ranges.

TABLE 2

| | Temperature level | | | | | | |
|---|---|---|---|---|---|---|---|
| | 1 | 2 | 3 | 4 | 5 | 6 | 7 |
| Temperature (° C.) | −40~−20 | −20~0 | 0~20 | 20~40 | 40~60 | 60~80 | 80~100 |

In Table 2, sections of temperature levels are set at intervals of 20° C. However, the sections of the temperature levels are not limited to the intervals of 20° C. When the operating environment of the FMEM is subjected to a small variation in temperature, the sections of the temperature levels may be set at smaller intervals than the intervals of 20° C. For example, the sections of the temperature levels may be set at intervals of 10° C. In contrast, when the operating environment of the FMEM is subjected to a big variation in temperature, the sections of the temperature levels may be set at greater intervals than the intervals of 20° C. The intervals of the sections at which operation parameter values do not greatly vary according to a variation in temperature may be experimentally determined during a test operation. Also, a larger number of temperature levels may be set, and the temperature levels may be set according to temperatures expressed in decimal form. By setting the temperature levels according to the temperature sections, configuration data CDAT-1 to CDAT-n corresponding to the respective temperature levels may be stored in the configuration data areas CDA.

Temperature levels may be set using a combination of the methods associated with Tables 1 and 2. For instance, the temperature levels may be set according to discrete temperatures, such as a first temperature level (−15° C.), a second temperature level (0 to 20° C.), and a third temperature level (30° C.), and according to sections set at intervals of 20° C. Also, the temperature levels may be set according to sensitivity of the FMEM to temperature. For example, when the FMEM is insensitive to variations in temperature, only a small number of temperature levels may be set; while when the FMEM is sensitive to variations in temperature, a large number of temperature levels may be set. In this case, the temperature levels may be set according to discrete temperatures, as shown in Table 1, or set according to predetermined temperature sections, as shown in Table 2.

Figure 5A:
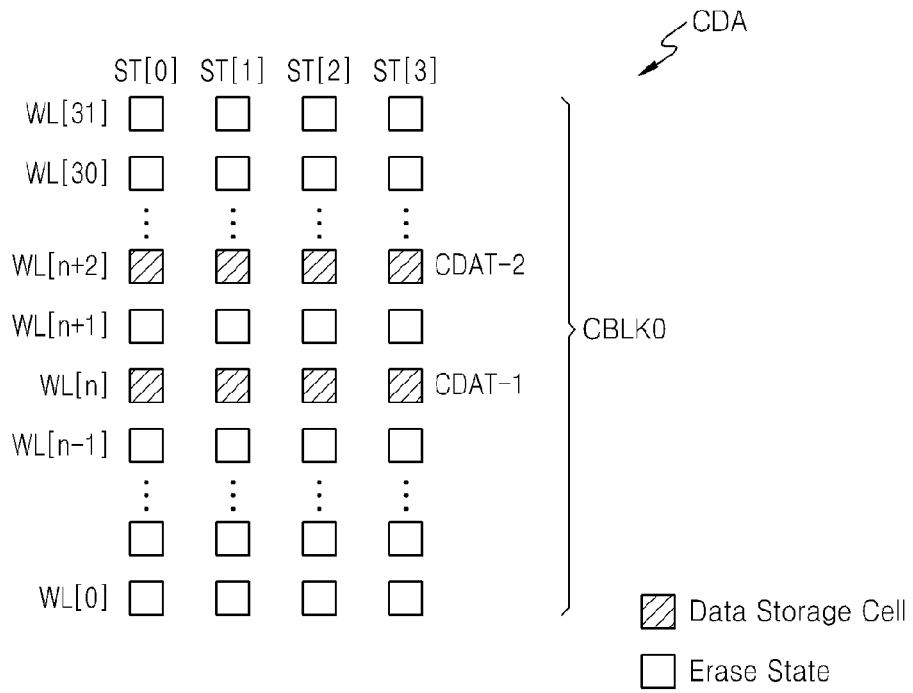
FIGS. 5A and 5B are diagrams showing a method of storing configuration data, according to exemplary embodiments of the inventive concept.
Figure 5B:
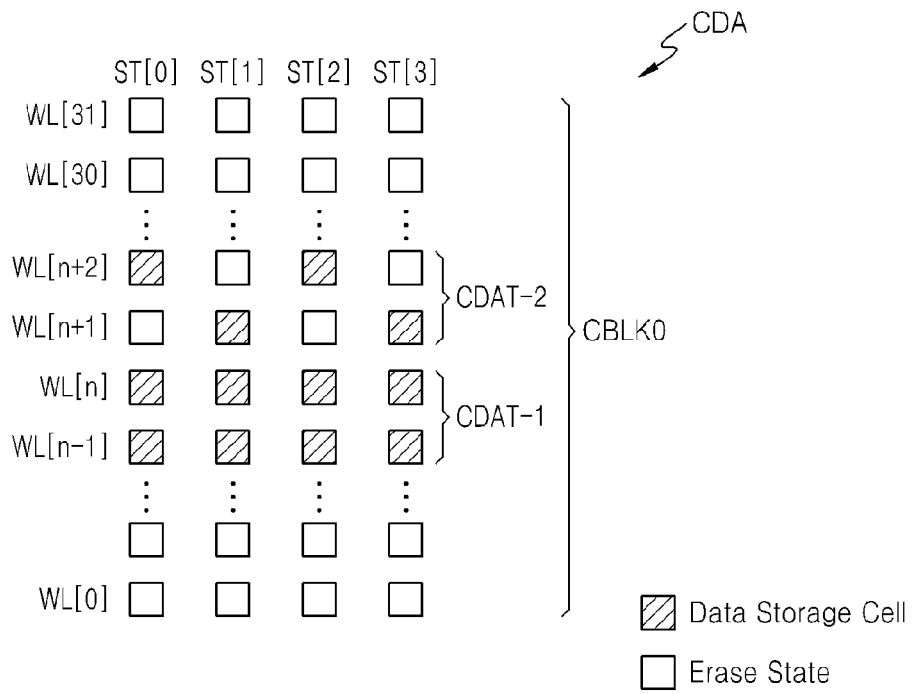

A plurality of pieces of configuration data CDAT-1 to CDAT-n may be stored in the configuration data area CDA in a variety of different manners. FIG. 5A illustrates a method of storing the plurality of pieces of configuration data CDAT-1 to CDAT-n in the configuration data area CDA, according to an exemplary embodiment of the inventive concept, and FIG. 5B illustrates a method of storing the plurality of pieces of configuration data CDAT-1 to CDAT-n in the configuration data area CDA, according to another exemplary embodiment of the inventive concept. Hereinafter, only the same points of the respective embodiments will be described, and memory cells located at intersections between word lines [WL] and strings [ST] are illustrated with squares in FIGS. 5A and 5B. In particular, the memory cells in which each of the plurality pieces of configuration data CDAT-1 to CDAT-n are stored are illustrated by cross-hatching. A plurality of pieces of configuration data CDAT-1 to CDAT-n may include first configuration data CDAT-1 corresponding to a first temperature level and second configuration data CDAT-2 corresponding to a second temperature level. In FIGS. 5A and 5B, both the first and second configuration data CDAT-1 and CDAT-2 are stored in the same block CBLK-0 of the memory cell array MCA.

Referring to FIG. 5A, each of the bits of first configuration data CDAT-1 may be stored in the corresponding one of memory cells connected to one of a plurality of word lines WL[0] to WL[31]. Similarly, each of the bits of second configuration data CDAT-2 may be stored in the corresponding one of memory cells connected to one of the plurality of word lines WL[0] to WL[31]. For example, each of the bits of the first configuration data CDAT-1 may be stored in the corresponding one of the memory cells connected to a word line WL[n] and respective strings ST[0], ST[1], ST[2], and ST[3]. Each of the bits of the second configuration data CDAT-2 may be stored in the corresponding one of the memory cells connected to a word line WL[n+2] and the respective strings ST[0], ST[1], ST[2], and ST[3].

Referring to FIG. 5B, bits of the first configuration data CDAT-1 may be respectively stored in memory cells connected to two of a plurality of word lines WL[0] to WL[31]. For example, the first configuration data CDAT-1 may be duplicately stored in memory cells connected to strings ST[0], ST[1], ST[2], and ST[3] connected to each of word lines WL[n−1] and WL[n]. The word lines WL[n−1] and WL[n] may be disposed in sequence or apart from each other. Similarly, bits of the second configuration data CDAT-2 may be respectively stored in memory cells connected to two of the plurality of word lines WL[0] to WL[31]. For instance, the second configuration data CDAT-2 may be stored in memory cells connected to strings ST[0] and ST[2] of a word line WL[n+2] and strings ST[1] and ST[3] of a word line[n+1].

Figure 6A:
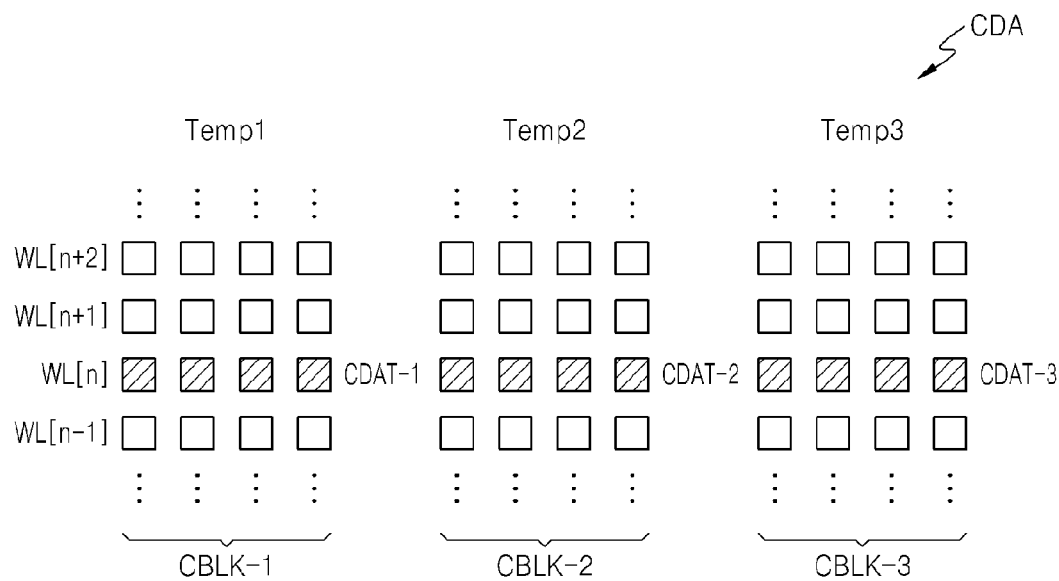
FIGS. 6A and 6B are diagrams showing a method of storing configuration data, according to exemplary embodiments of the inventive concept.
Figure 6B:
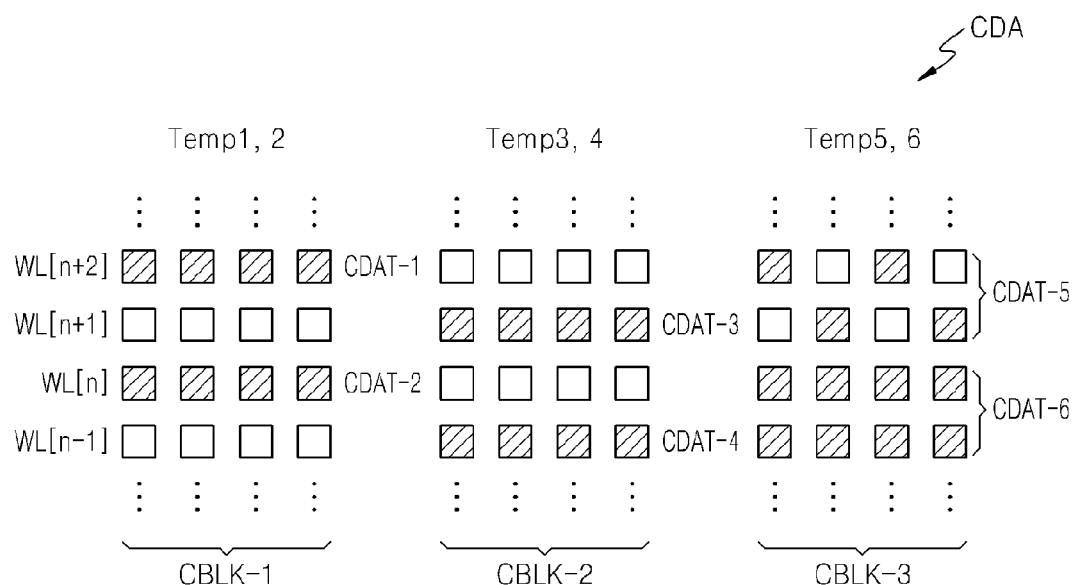

FIG. 6A illustrates a method of storing a plurality of pieces of configuration data CDAT-1 to CDAT-n, according to another exemplary embodiment of the inventive concept, and FIG. 6B illustrates a method of storing a plurality of pieces of configuration data CDAT-1 to CDAT-n, according to another exemplary embodiment of the inventive concept. In FIGS. 6A and 6B, the plurality of pieces of configuration data CDAT-1 to CDAT-n are stored in different blocks CBLK-1, CBLK-2, and CBLLK-3. Referring to FIG. 6A, first configuration data CDAT-1 may be stored in the block CBLK-1, second configuration data CDAT-2 may be stored in the block CBLK-2, and third configuration data CDAT-3 may be stored in the block CBLK-3. Bits of each of the configuration data CDAT-1 to CDAT-n may be respectively stored in memory cells connected to a word line WL[n] and respective strings ST[0], ST[1], ST[2], and ST[3] of the corresponding block. However, the inventive concept is not limited thereto, and the bits of each of the configuration data CDAT-1 to CDAT-n may be stored in memory cells connected to other word lines of the block. Also, the first configuration data CDAT-1 and second configuration data CDAT-2 may be stored in any one of the blocks CBLK-1, CBLK-2 and CBLK-3 (refer to FIGS. 5A and 5B), and third configuration data CDAT-3 may be stored in another block.

Referring to FIG. 6B, the plurality of pieces of configuration data CDAT-1 to CDAT-n may include first through sixth configuration data CDAT-1 to CDAT-6 corresponding respectively to first through sixth temperature levels. The first and second configuration data CDAT-1 and CDAT-2 may be stored in the block CBLK-1, the third and fourth configuration data CDAT-3 and CDAT-4 may be stored in the block CBLK-2, and the fifth and sixth configuration data CDAT-5 and CDAT-6 may be stored in the block CBLK-3. The first to sixth configuration data CDAT-1 to CDAT-6 stored in the blocks CBLK-1 to CBLK-3 may be stored in the manner described with reference to FIGS. 5A and 5B.

According to the above-described methods of storing the plurality of pieces of configuration data CDAT-1 to CDAT-n according to the embodiments, since the influence of a back pattern (or the influence of patterns of other cells when data is read from a specific cell of one string) may be prevented, a sufficient read margin may be effectively ensured. In particular, when configuration data is stored in a plurality of memory cells, a failure in reading configuration data in some memory cells due to charge loss may be prevented. Thus, even if a temperature level is changed due to a variation in temperature, configuration data CDAT corresponding to the changed temperature level may be precisely read, thereby preventing the operating circumstances of the FMEM from being erroneously set. As a result, optimized operation parameter values may be reset at respective temperature levels, thereby improving the reliability of the FMEM.

Figure 7:
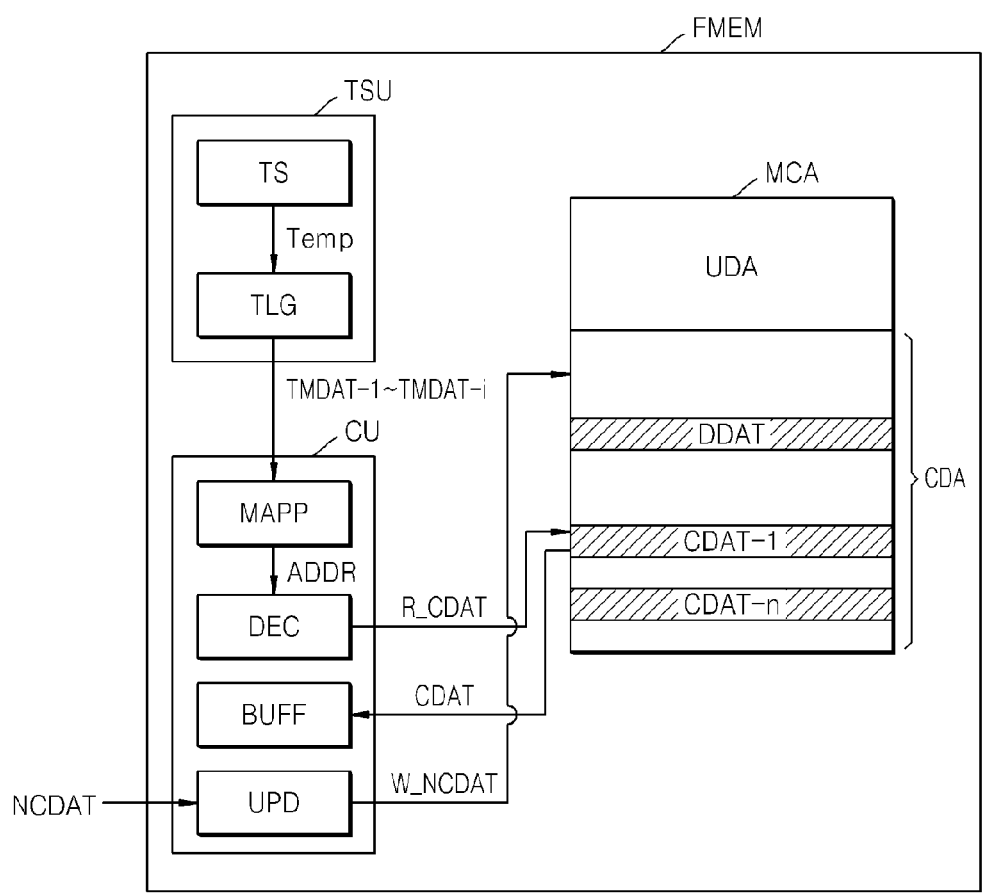
FIG. 7 is a diagram showing additional details of the flash memory device of FIG. 1.

Subsequently, referring to FIG. 7, which illustrates additional details of the FMEM of FIG. 1, the temperature sensing unit TSU may measure a temperature of the FMEM and generate temperature level data TMDAT. The temperature sensing unit TSU may include a temperature sensor TS configured to continuously sense a variation in an outer or inner temperature of the FMEM during application of power to the FMEM or during operation of the FMEM and measure a varying temperature. Also, the temperature sensor TS may sense an inner temperature of the FMEM, that is, a variation in temperature due to a program, read, or erase operation, and measure a varying temperature.

The temperature sensor TS may transmit data regarding a measured temperature Temp and transmit the temperature data to a temperature level generator TLG. The temperature level generator TLG may generate temperature level data TMDAT-1 to TMDAT-I based on the transmitted temperature data. That is, a temperature level may be determined using the same method as a method of setting temperatures corresponding to configuration data CDAT-1 to CDAT-n based on the measured temperature, and temperature level data TMDAT may be generated according to the determined temperature level. For example, referring to a method of setting a temperature level shown in Table 1 on assumption that a measured temperature Temp is 25° C., the control unit CU may determine a fifth temperature level and generate fifth temperature level data TMDAT-5. However, referring to a method of setting a temperature level shown in Table 2, the control unit CU may determine a fourth temperature level and generate fourth temperature level data TMDAT-4.

The control unit CU may read configuration data CDAT corresponding to the temperature level data TMDAT transmitted from the temperature sensing unit TSU and set operation parameter values. The control unit CU may include a mapping table MAPP configured to receive the temperature level data TMDAT and map the temperature level data TMDAT to the corresponding address of the configuration data CDAT. The mapping table MAPP may generate address data ADDR regarding the configuration data CDAT from the temperature level data TMDAT. Also, the control unit CU may include a decoder DEC configured to decode the address data ADDR of the configuration data CDAT. The decoder DEC may generate a read signal R_CDAT of the corresponding configuration data CDAT and transmit the read signal R_CDAT to the memory cell array MCA or read the configuration data CDAT from the memory cell array MCA.

In addition, the control unit CU may include a buffer BUFF configured to store the read configuration data CDAT-1 to CDAT-n. The buffer BUFF may store the read configuration data CDAT-1 to CDAT-n and set operating circumstances corresponding to a varying temperature level without reading additional configuration data CDAT when a variation in temperature level is repeated. Also, the buffer BUFF may temporarily store the read configuration data CDAT-1 to CDAT-n and transmit the temporarily stored read configuration data CDAT-1 to CDAT-n to a configuration unit (not shown) configured to set the operation parameter values.

Furthermore, the control unit CU may include an updater UPD configured to update the configuration data CDAT-1 to CDAT-n. When the FMEM is exposed for a long time in specific operating circumstances and needs to reset the operation parameter values OPV-1 to OPV-m at each temperature level, the updater UPD may receive updated configuration data NCDAT from a user or an external host (not shown). Also, the updater UPD may transmit a write signal W_NCDAT to the memory cell array MCA to write the updated configuration data NCDAT in the configuration data area CDA of the memory cell array MCA. Furthermore, the updater UPD may write the updated configuration data NCDAT in the memory cell array MCA. Also, when the set temperature levels are reset, the updater UPD may update the configuration data of the memory cell array MCA to configuration data corresponding to changed temperature levels. Accordingly, the FMEM according to the embodiment may set operating circumstances more precisely by updating the configuration data CDAT-1 to CDAT-n, thereby enhancing operating reliability.

Specifically, the operation of the control unit CU will now be described. When power is applied from a power source unit (not shown) to the FMEM, the control unit CU may read default configuration data DDAT regarding the setting of default values of various operation parameters. Also, operation parameter values of the FMEM may be set based on the default configuration data DDAT. In addition, the control unit CU may receive temperature level data TMDAT from the temperature sensing unit TSU during operation of the FMEM. The control unit CU may read configuration data CDAT corresponding to the temperature level data TMDAT and set operation parameter values optimized for a temperature level. Also, when the temperature level varies, the control unit CU may receive temperature level data TMDAT corresponding to the varied temperature level, read configuration data CDAT corresponding to the received the temperature level data TMDAT, and thus reset operation parameter values according to the varying temperature level. For example, when the temperature level varies from a first temperature level to a second temperature level, the control unit CU may read second configuration data CDAT-2 corresponding to the second temperature level based on the received temperature level data TMDAT. When the temperature level varies from the second temperature level to the first temperature level, the same result may be obtained.

The FMEM according to an exemplary embodiment of the inventive concept may read configuration data CDAT corresponding to each temperature level and update operation parameter values according to a variation in temperature level so that the FMEM can operate in optimized operating circumstances. That is, a threshold voltage of a memory cell may be prevented from being affected by a variation in temperature so that a highly integrated FMEM can effectively ensure a sufficient margin between memory cells. Accordingly, the FMEM according to an exemplary embodiment of the inventive concept may operate under optimum conditions in various operating circumstances, thereby reducing the potential for malfunctions and improving reliability.

Figure 8:
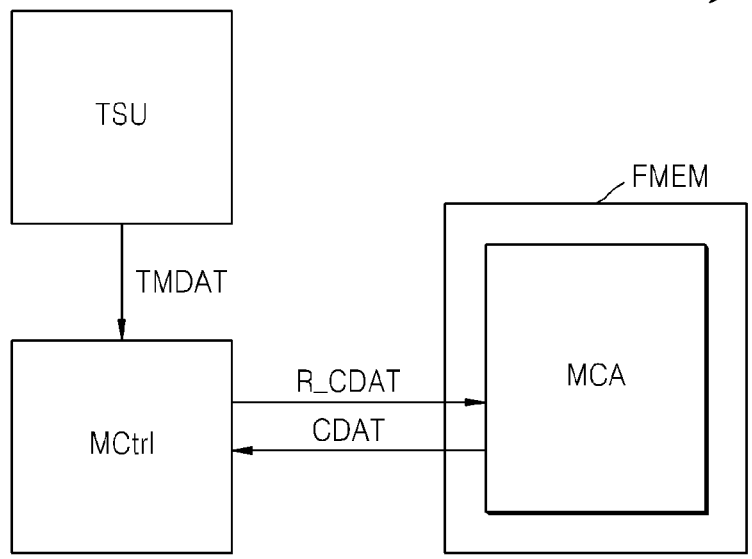
FIG. 8 is a block diagram of a memory system according to an exemplary embodiment of the inventive concept.

FIG. 8 is a block diagram of a memory system MSYS according to an exemplary embodiment of the inventive concept. Referring to FIG. 8, the memory system MSYS may include an FMEM including a memory cell array MCA, a temperature sensing unit TSU, and a memory controller MCtrl configured to control the reading of configuration data. The memory system MSYS according to the inventive concept may set operating conditions according to a temperature level and effectively cope with a variation in temperature.

Specifically, the FMEM may include the memory cell array MCA, which may store a plurality of pieces of configuration data CDAT-1 to CDAT-n. Also, the memory cell array MCA may store default configuration data DDAT regarding the setting of default operating circumstances, that is, default operation parameter values.

The memory cell array MCA may include a user data area UDA in which user data is stored and a configuration data area CDA in which configuration data is stored. A plurality of pieces of configuration data CDAT-1 to CDAT-n may be stored in the configuration data area DCA of the memory cell array MCA in various ways. For example, first configuration data CDAT-1 corresponding to a first temperature level and second configuration data CDAT-2 corresponding to a second temperature level may be stored in the same block of the memory cell array MCA. Alternatively, the first configuration data CDAT-1 and the second configuration data CDAT-2 may be stored in different blocks. Each of the bits of each of the first and second configuration data CDAT-1 and CDAT-2 may be stored in the corresponding one of word lines of a block or duplicately stored in two of the word lines of the block. The plurality of pieces of configuration data CDAT-1 to CDAT-n may be used to set operating circumstances at a predetermined temperature level and include data regarding optimized operation parameter values at each temperature level. Temperature levels may be set according to discrete temperatures or temperature sections. Since the above-described methods of storing data and setting temperature levels will be understood with reference to the above-described examples, a detailed description thereof is not provided to avoid redundancy.

The temperature sensing unit TSU of the memory system MSYS may measure a temperature of the FMEM and generate temperature level data TMDAT using the measured temperature Temp. The memory controller MCtrl may generate address data ADDR regarding configuration data CDAT based on the temperature level data TMDAT, decode the address data ADDR of the configuration data CDAT, and generate a read signal R_CDAT. Accordingly, the memory controller MCtrl may transmit the corresponding read signal R_CDAT of the configuration data CDAT and read the configuration data CDAT from the memory cell array MCA.

Specifically, the memory controller MCtrl may read default configuration data DDAT during application of power from a power source unit (not shown) and set respective operation parameter values as default values using the default configuration data DDAT. During operation of the FMEM, the memory controller MCtrl may receive temperature level data TMDAT from the temperature sensing unit TSU and read configuration data CDAT corresponding to a temperature level of the temperature level data TMDAT from the FMEM. Also, the memory controller MCtrl may set operation parameter values of the FMEM using the read configuration data CDAT. Since the operations and functions of the temperature sensing unit TSU and the memory controller MCtrl will be understood with reference to the above-described examples, a detailed description thereof is not provided to avoid redundancy.

Figure 9:
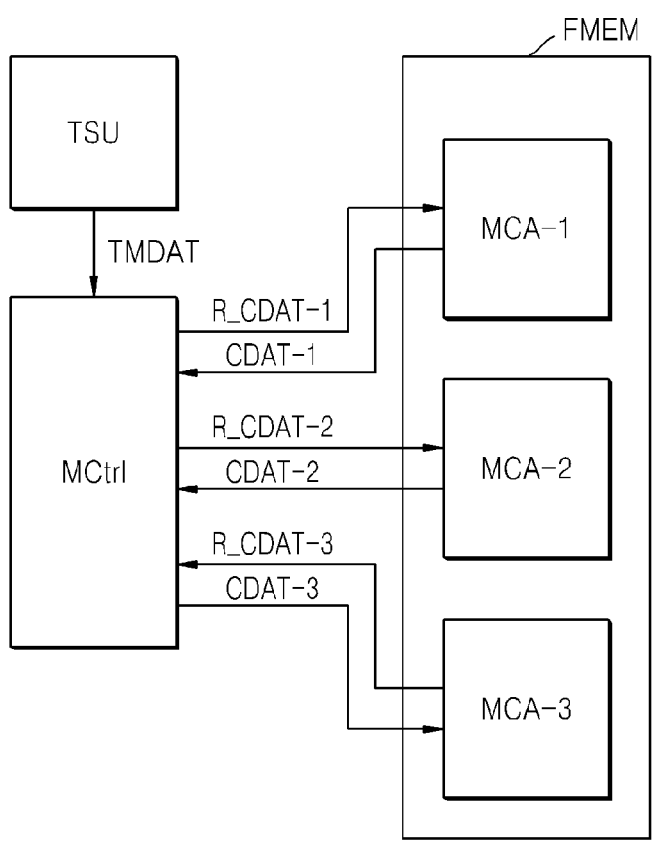
FIG. 9 is a block diagram showing additional details of the memory system of FIG. 8.

FIG. 9 is a detailed block diagram of the memory system MSYS of FIG. 8. Referring to FIG. 9, the memory system MSYS may include a plurality of memory cell arrays MCA-1, MCA-2, and MCA-3. A plurality of pieces of configuration data CDAT-1 to CDAT-n may include first configuration data CDAT-1 corresponding to a first temperature level, second configuration data CDAT-2 corresponding to a second temperature level, and third configuration data CDAT-3 corresponding to a third temperature level. The first configuration data CDAT-1 may be stored in the memory cell array MCA-1, the second configuration data CDAT-2 may be stored in the memory cell array MCA-2, and the third configuration data CDAT-3 may be stored in the memory cell array MCA-3. However, the inventive concept is not limited thereto. The first through third configuration data CDAT-1 to CDAT-3 may be stored in any one of the memory cell arrays MCA-1, MCA-2, and MCA-3. Furthermore, the first through third configuration data CDAT-1 to CDAT-3 may be duplicately stored in each of the plurality of memory cell arrays MCA-1, MCA-2, and MCA-3. As described above, the configuration data CDAT-1 to CDAT-n may be stored in various ways.

The temperature sensing unit TSU may measure a temperature of the FMEM and generate temperature level data TMDAT. The memory controller MCtrl may generate read signals R_CDAT-1, R_CDAT-2, and R_CDAT-3 based on the temperature level data TMDAT and read the configuration data CDAT-1 to CDAT-n from the each of the plurality of memory cell arrays MCA-1, MCA-2 and MCA-3. For example, the memory controller MCtrl may generate read signals R_CDAT-1, R_CDAT-2, and R_CDAT-3 of first through third configuration data CDAT-1, CDAT-2, and CDAT-3 based on temperature level data TMDAT-1, TMDAT-2, and TMDAT-3 corresponding respectively to first through third temperature levels. Also, the memory controller MCtrl may transmit one of the read signals R_CDAT-1, R_CDAT-2, and R_CDAT-3 to the FMEM and read configuration data CDAT corresponding to a temperature level of the FMEM.

Also, the memory controller MCtrl may set parameter values of the FMEM using the read configuration data CDAT. For instance, when it is determined that a temperature Temp measured by the temperature sensing unit TSU has a first temperature level, the memory controller MCtrl may transmit the read signal R_CDAT-1 of the first configuration data CDAT-1 to the memory cell array MCA-1, read the first configuration data CDAT-1 from the memory cell array MCA-1, and set operation parameters of the FMEM.

Figure 10A:
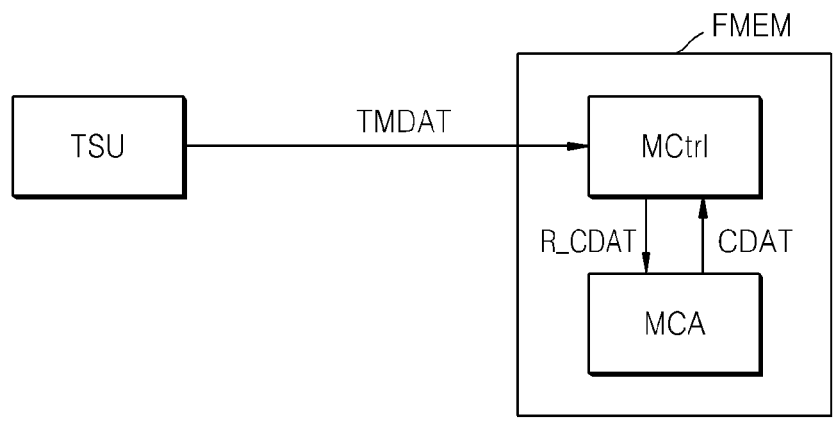
FIGS. 10A and 10B are diagrams of the memory system of FIG. 8, according to exemplary embodiments of the inventive concept.
Figure 10B:
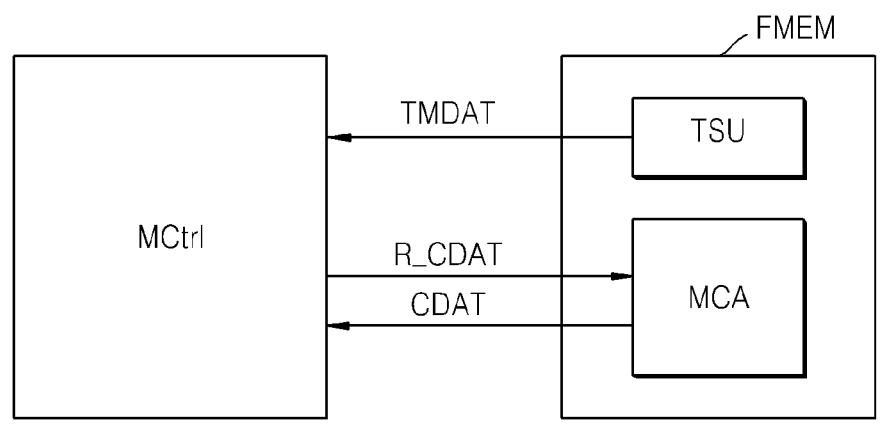

FIG. 10A is a diagram of the memory system MSYS of FIG. 8, according to another exemplary embodiment of the inventive concept. Referring to FIG. 10A, a memory controller MCtrl of the memory system MSYS may be included in the FMEM. FIG. 10B is a diagram of the memory system MSYS of FIG. 8, according to another exemplary embodiment of the inventive concept. Referring to FIG. 10B, a temperature tensing unit TSU of the memory system MSYS may be included in an FMEM.

Figure 11A:
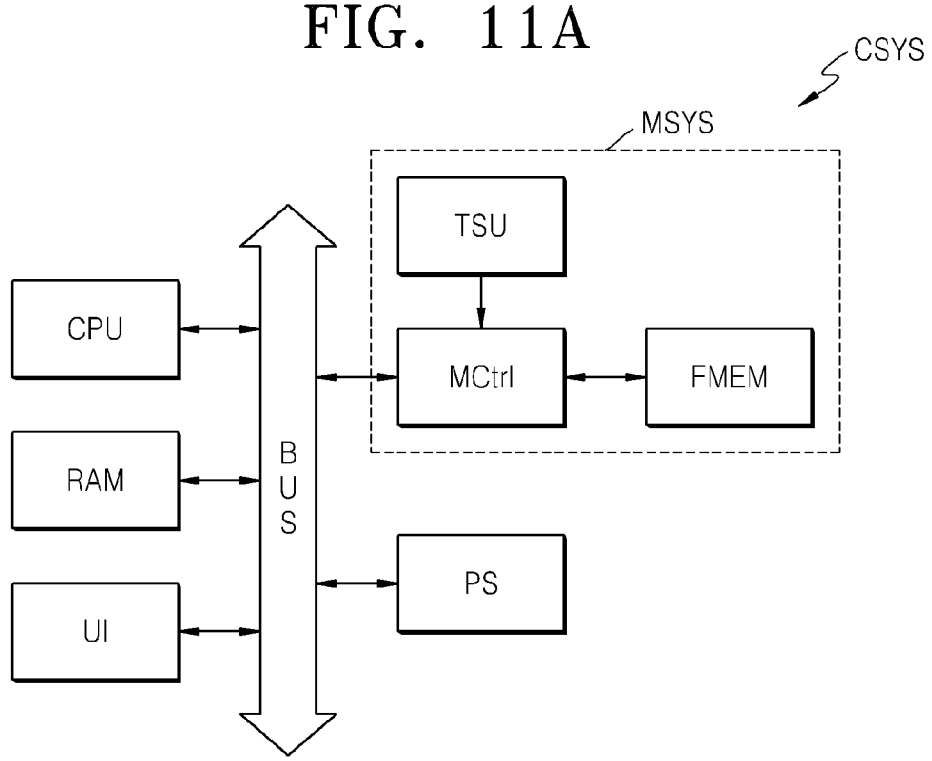
FIGS. 11A and 11B are block diagrams of a computing system including the memory system of FIG. 8, according to exemplary embodiments of the inventive concept.
Figure 11B:
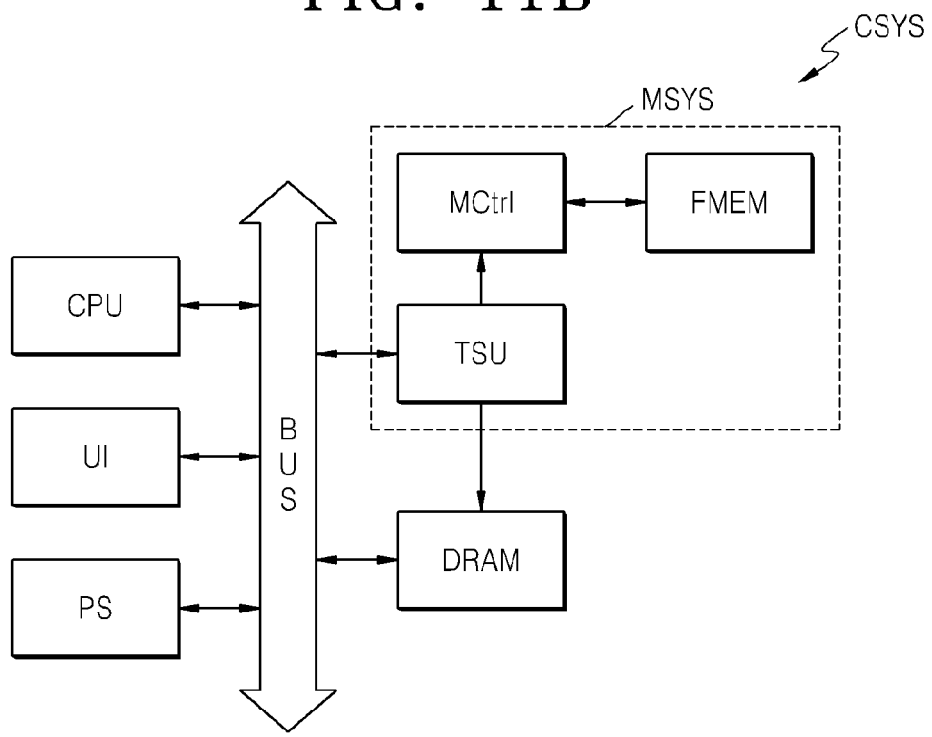

FIGS. 11A and 11B are block diagrams of a computing system CSYS including the memory system MSYS of FIG. 8, according to exemplary embodiments of the inventive concept.

Referring to FIG. 11A, the computing system CSYS according to the embodiment may include a central processing unit CPU, a user interface UI, and a memory system MSYS that are electrically connected to each other via a bus BUS. The memory system MSYS may include the memory controller MCtrl, the temperature sensing unit TSU, and the FMEM. N-bit data (N is an integer equal to or greater than 1) processed or to be processed by the CPU may be stored in the FMEM by the memory controller MCtrl. Accordingly, since occurrence of errors in the memory system MSYS due to a variation in temperature level may be reduced, the reliability of the computing system CSYS may be enhanced.

The computing system CSYS according to the embodiment of the inventive concept may further include a power supply device PS. Also, the computing system CSYS according to the embodiment of the inventive concept may further include a volatile memory device (e.g., a RAM). When the computing system CSYS according to the embodiment is a mobile device, the computing system CSYS may further include a battery, which is configured to supply an operating voltage of the computing system CSYS, and a modem, such as a baseband chipset. In addition, the computing system CSYS may further include an application chipset, a camera image processor (CIP), or a mobile DRAM.

Referring to FIG. 11B, the computing system CSYS according to the embodiment of the inventive concept may include a DRAM as a volatile memory device. In particular, since a refresh period of the DRAM varies according to a variation in temperature to cause malfunctions, a temperature sensor configured to compensate for the variation in temperature may be employed. In this case, the temperature sensor may be shared between the DRAM and the temperature sensing unit TSU of the memory system MSYS. Thus, by use of one temperature sensor, the occurrence of errors in the FMEM of the computing system CSYS due to a variation in temperature levels may be reduced, and stabilization of the refresh period of the DRAM with a variation in temperature level may be enabled.

Figure 12:
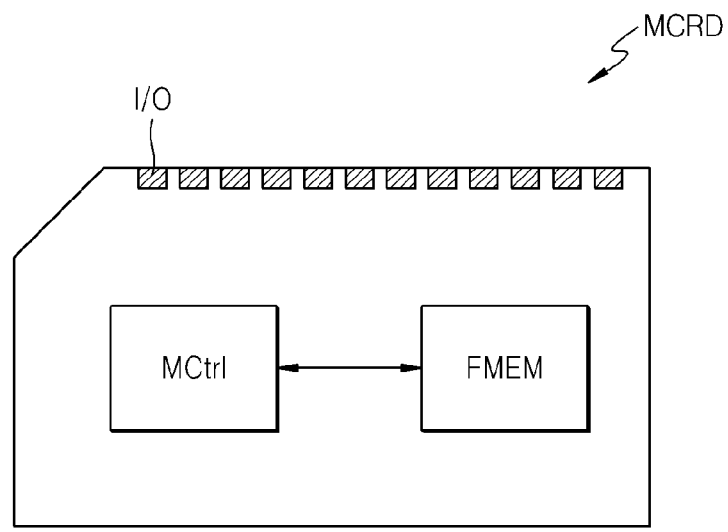
FIG. 12 is a block diagram of a memory card according to an exemplary embodiment of the inventive concept.

FIG. 12 is a diagram of a memory card MCRD according to an exemplary embodiment of the inventive concept.

Referring to FIG. 12, the memory card MCRD may include a memory controller MCtrl and the FMEM of FIG. 10A or 10B. The memory controller MCtrl may control writing of data to the FMEM or the reading of the data from the FMEM in response to a request received from an external host (not shown) through an input/output (I/O) unit. Also, the memory controller MCtrl may control an erase operation related to the FMEM. To perform the above-described control operation, the memory controller MCtrl of the memory card MCRD according to the exemplary embodiment of the inventive concept may include interface units (not shown) configured to interface with the host and the FMEM, respectively, and a RAM. When the RAM included in the memory card MCRD is a DRAM, a temperature sensor may be shared between the DRAM and the FMEM, as shown in FIG. 11B. Thus, even if a temperature level varies, malfunctions may be reduced during data read and write operations, thereby improving the reliability of the memory card MCRD.

The memory card MCRD of FIG. 12 may be embodied by a compact flash card (CFC), a Microdrive, a smart media card (SMC), a multimedia card (MMC), a security digital card (SDC), a memory stick, or a universal serial bus (USB) flash memory drive.

Figure 13:
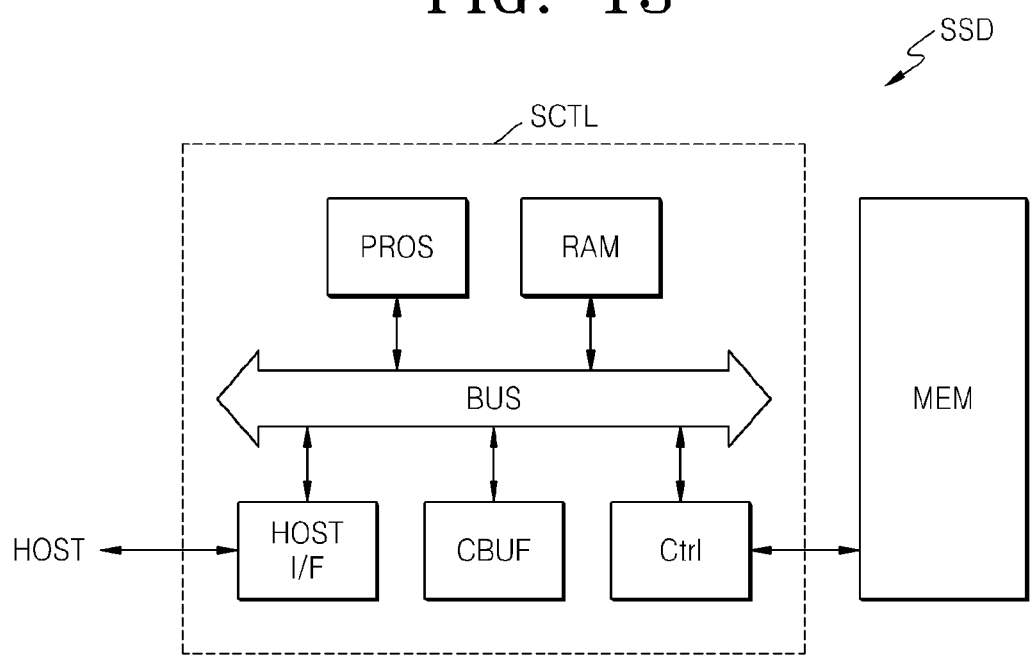
FIG. 13 is a block diagram of a solid-state drive (SSD) according to an exemplary embodiment of the inventive concept.

FIG. 13 is a block diagram of a solid-state drive (SSD) according to an exemplary embodiment of the inventive concept.

Referring to FIG. 13, the SSD according to the exemplary embodiment may include an SSD controller SCTL and a memory device MEM. The SSD controller SCTL may include a processor PROS, a RAM, a cache buffer CBUF, and a memory controller Ctrl that are electrically connected to each other via a bus BUS. The processor PROS may control the memory controller Ctrl to transmit or receive data to or from the memory device MEM in response to requests (commands, addresses, or data) of an external host (not shown). The processor PROS and the memory controller Ctrl of the SSD according to the exemplary embodiment may be embodied by a single advanced risk machine (ARM) processor. Data required for an operation of the processor PROS may be loaded on the RAM. A host interface HOST OF may transmit the requests from the host to the processor PROS or transmit data from the memory device MEM to the host. The host interface HOST OF may interface with the host through various interface protocols, such as USB, man machine communication (MMC), peripheral component interconnect-express (PCI-E serial advanced technology attachment (SATA), parallel advanced technology attachment (PATA), small computing system interface (SCSI), enhanced small device interface (ESDI), or intelligent drive electronics (IDE). Data to be transmitted to the memory device MEM or data transmitted from the memory device MEM may be temporarily stored in the cache buffer CBUF. The cache buffer CBUF may be a static RAM (SRAM). The memory controller Ctrl and the memory device MEM included in the SSD according to the exemplary embodiment may be respectively the memory controller MCtrl and the FMEM of FIG. 10A or 10B. Also, when the RAM included in the SSD is a DRAM, a temperature sensor may be shared between the memory controller Ctrl and the memory device MEM, as shown in FIG. 11B. Accordingly, since occurrence of errors due to a variation in temperature level can be reduced, the reliability of the SSD may be enhanced.

Figure 14:
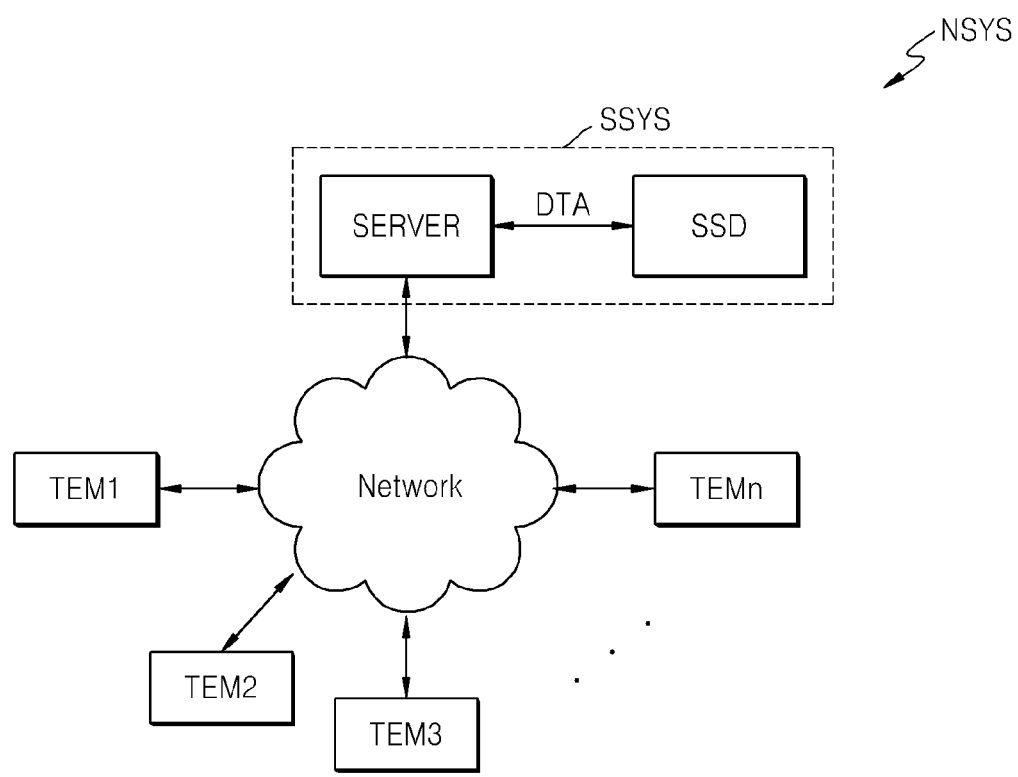
FIG. 14 is a diagram of a network system including a server system including the SSD of FIG. 13, according to an exemplary embodiment of the inventive concept.

FIG. 14 is a diagram of a network system NSYS including a server system SSYS including the SSD of FIG. 13, according to an exemplary embodiment of the inventive concept.

Referring to FIG. 14, the network system NSYS according to the exemplary embodiment may include the server system SSYS and a plurality of terminals TEM1 to TEMn, which may be connected to each other through a network. The server system SSYS according to the exemplary embodiment may include a server SERVER configured to process requests received from the plurality of terminals TEM1 to TEMn connected to the network and the SSD configured to store data corresponding to the requests received from the terminals TEM1 to TEMn. In this case, the SSD of FIG. 14 may be the SSD of FIG. 13. That is, the SSD of FIG. 14 may include the memory controller MCtrl and the FMEM according to the exemplary embodiment of the inventive concept. Accordingly, since occurrence of errors due to a variation in temperature level can be reduced, the reliability of the server system SSYS including the SSD and the network system including the server system may be enhanced.

The above-described FMEM and memory system including the same according to the exemplary embodiments of the inventive concept may be mounted using packages having various shapes, for example, a package on package (PoP), a ball grid array (BGA), a chipscale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multi-chip package (MCP), a wafer-level fabricated package (WFP), or a wafer-level processed stack package (WSP).

While the inventive concept has been particularly shown and described with reference to exemplary embodiments thereof, it will be understood that various changes in form and details may be made therein without departing from the spirit and scope of the following claims.

What is claimed is:

1. A flash memory device comprising:
a memory cell array configured to store user data and a plurality of pieces of configuration data corresponding to respective temperature levels of the flash memory device, the pieces of configuration data indicative of respective operation parameter values of the flash memory device;
a temperature sensing unit configured to measure an ambient temperature of the flash memory device and to generate temperature level data; and
a control unit configured to receive the temperature level data from the temperature sensing unit, to access the memory cell array at an address derived from the temperature level data received from the temperature sensing unit, to read a piece of configuration data corresponding to the temperature level data from among the plurality of pieces of configuration at the address of the memory cell array, and to set operation parameters of the flash memory device according to an operation parameter value indicated by the read piece of configuration data.

2. The device of claim 1, wherein the temperature levels corresponding respectively to the plurality of pieces of configuration data are set according to discrete temperatures.

3. The device of claim 1, wherein the plurality of pieces of configuration data include first configuration data corresponding to a first temperature level and second configuration data corresponding to a second temperature level,
wherein each of the first and second configuration data is indicative of a direct-current (DC) level value or a boosting scheme option.

4. The device of claim 3, wherein the first and second configuration data are stored in a same memory block of the memory cell array, and the user data is stored in other memory blocks of the memory cell array.

5. The device of claim 3, wherein the first and second configuration data are stored in different memory blocks of the memory cell array, and the user data is stored in other memory blocks of the memory cell array.

6. The device of claim 1, wherein the plurality of pieces of configuration data stored in the memory cell array is reprogrammable in response to a user input or an external host.

7. The device of claim 1, wherein the temperature sensing unit comprises:
a temperature sensor configured to measure the temperature of the flash memory device; and
a temperature level generator configured to determine the temperature level of the flash memory device using the measured temperature and to generate the temperature level data received by the control unit.

8. The device of claim 1, wherein the control unit comprises:
a mapping table configured to receive the temperature level data from the temperature sensing unit, and to map the temperature level data to an address of the configuration data corresponding to the temperature level data; and
a decoder configured to decode the address mapped by the mapping table and read the configuration data from the memory cell array.

9. The device of claim 1, wherein the control unit includes a buffer configured to store the read configuration data.

10. The device of claim 1, wherein the control unit comprises an updater configured to receive a plurality of pieces of updated configuration data from a user or an external host and to write the plurality of pieces of updated configuration data to the memory cell array.

11. A memory system comprising:
a flash memory device configured to store user data and a plurality of pieces of configuration data indicative of operation parameter values at temperature levels set according to predetermined temperature sections or discrete temperatures;
a temperature sensing unit configured to measure an ambient temperature of the flash memory device and to generate temperature level data; and
a memory controller configured to receive the temperature level data from the temperature sensing unit, to access the flash memory device at an address derived from the temperature level data received from the temperature sensing unit, to read one piece of configuration data corresponding to the temperature level data among the plurality of pieces of configuration data at the address of the flash memory device, and to set operation parameter values using the read piece of configuration data.

12. The system of claim 11, wherein each of the plurality of pieces of configuration data includes a direct-current (DC) level value or boosting scheme option.

13. The system of claim 11, wherein the plurality of pieces of configuration data is variable in response to a user input or an external host.

14. The system of claim 11, wherein one of the temperature sensing unit and the memory controller is contained in the flash memory device, and the other of the temperature sensing unit and the memory controller is external the flash memory device.

15. A memory device comprising:
a temperature sensing unit configured to measure an ambient temperature of the memory device and to generate temperature level data;
a flash memory array including a user data area comprising multilevel cell (MLC) memory cells and storing user data, and a configuration data area storing a plurality of pieces of configuration data indicative of respective read parameters of a read operation of the MLC memory cells, the plurality of pieces of configuration data corresponding to respectively different measured ambient temperatures of the memory device; and a control unit configured to receive the temperature level data from the temperature sensing unit, and to execute a read operation of the MLC memory cells using a read parameter indicated by a piece of configuration data corresponding to the temperature level data among the plurality of pieces of configuration data, wherein the control unit includes a mapping table which maps the temperature level data to an address of the memory cell array of the piece of configuration data corresponding to the temperature level data.

* * * * *